United States Patent [19]
Benson et al.

[11] Patent Number: 5,774,343
[45] Date of Patent: Jun. 30, 1998

[54] HINGED FRONT PANEL ASSEMBLY FOR CIRCUIT CARDS

[75] Inventors: Matthew C. Benson, Fitchburg; Kenneth D. Gagnon, Westminster, both of Mass.

[73] Assignee: Digital Equipment Corporation, Maynard, Mass.

[21] Appl. No.: 671,856

[22] Filed: Jun. 28, 1996

[51] Int. Cl.⁶ ..................................................... H05K 7/14
[52] U.S. Cl. ........................ 361/796; 361/729; 361/788; 361/801; 361/803; 257/686; 211/150
[58] Field of Search ..................... 361/685, 686, 361/728, 729, 730–732, 735, 736, 740, 747, 752, 756, 759, 784, 785, 788, 790, 796, 797, 801–804; 257/686; 211/150

[56] References Cited

U.S. PATENT DOCUMENTS

| | | | |
|---|---|---|---|
| 3,425,025 | 1/1969 | Williams | 361/732 X |
| 4,161,017 | 7/1979 | Pierce et al. | 361/759 X |
| 4,316,236 | 2/1982 | Lechner et al. | 361/831 |
| 4,501,460 | 2/1985 | Sisler | 361/730 |
| 4,558,914 | 12/1985 | Prager et al. | 361/686 X |

*Primary Examiner*—Leo P. Picard
*Assistant Examiner*—Jayprakash N. Gandhi
*Attorney, Agent, or Firm*—Gary E. Rose

[57] ABSTRACT

A modular front panel system for circuit cards utilizes hinged, interlockable, first and second circuit-card-carrying front panels. Each panel has a hinge component, e.g. a pivot element) that can mate with the component on the other panel (e.g., a groove). The hinged arrangement permits the panels to be releasably secured to one another so as to form a card assembly unit. The hinged arrangement also permits the panels to be moved angularly with respect to one-another, thereby facilitating assembly and disassembly of the two hinge components without obstruction by components mounted on the circuit cards. This is particularly well suited to applications in which the circuit cards have surface mounted connectors that mate and electrically connect when the panels are moved angularly. Moreover, the hinge arrangement permits a panel to be readily added and interlocked with, or removed from, an existing card assembly in electrical equipment, without requiring replacement of the existing front panel.

38 Claims, 9 Drawing Sheets

HINGED FRONT PANEL ASSEMBLY FOR CIRCUIT CARDS

FIELD OF THE INVENTION

The invention relates to electronic equipment such as computers, and more particularly to front panels, sometimes called bezels or handles, and their use for mounting circuit cards within electronic equipment.

BACKGROUND OF THE INVENTION

Electronic equipment such as computers are frequently of modular construction. The equipment includes typically a host or parent printed circuit board ("PCB" or circuit card), and one or more daughter circuit cards electronically connected to the host. In a widely used arrangement, a number of daughter cards, in this case called "mezzanine cards", mount in a parallel, stacked arrangement above a host board.

Embedded computers often employ such a stacked arrangement. Embedded computers are computers incorporated in other electronic equipment that perform specialized functions, such as missile tracking, medical testing, or manufacturing control. Embedded computers usually have a host PCB providing at least a processor and memory, and a number of add-on cards coupled to the host for providing I/O (input/output), such as bus interface, additional memory, and/or other functions.

Where a stacked card arrangement is used for a computer, whether embedded or stand-alone, the circuit cards are typically held and supported in a card rack. Electrical input and output for the circuit cards can be provided through a backplane or through front card panels, or both.

A backplane is an electrical connection system for electrically connecting together, directly or indirectly, a number of cards and/or other system components. The individual cards have electrical connectors, typically edge-mounted, that mate with corresponding connectors of the backplane.

The front panel is typically a face plate of one-piece, integral construction to which one or more cards are mounted. The face plate can constitute a bezel with a specific arrangement of slots and holes for accessing electrical devices on the cards, such as I/O connectors, special indicators or switches.

Industry standards such as IEEE P1386/Draft 2.0, dated Apr. 4, 1995, (incorporated herein by reference) define the mechanics and dimensions of host/daughter card arrangements equipped with front panels and adapted for use with a backplane.

Various standard heights of front panels are available for use with a corresponding number of circuit cards. For example, a single-card computer typically uses a one-high front panel, dual-board computers use two-high front panels, and so forth. Two-high and higher front panels typically hold the corresponding number of cards in a parallel, stacked arrangement, as noted above.

Typically, before inserting the circuit cards into the backplane, the cards are physically mounted on a suitably-high front panel. Afterwards, the card/panel assembly forms an integral unit, with the connectors for coupling the cards to the backplane usually mounted on the rear edges of the cards (i.e., opposite the front panel). The card/panel assembly maintains the connectors in registration with the mating connectors of the backplane. The front panels can then be used as "handles" for manually gripping the assembly, and sliding it into position on the card rack for connection with the backplane.

The arrangement described heretofore is generally suitable to its intended purposes; unfortunately, it has certain drawbacks and disadvantages. For example, upgrading or otherwise changing the configuration of the equipment can require replacing or adding circuit cards. This can be a complicated, inefficient procedure, requiring many steps: removal of the card/panel unit from the backplane, disassembly of a number of cards from the panel, replacing the panel as necessary with a suitable panel for the number and bezel-needs of cards in the new configuration, assembly of the new card/panel unit, and installation of the new unit into the backplane. This procedure involves handling of the cards to such an extent that it poses a significant risk of their damage. It is so complicated that it typically requires trained field service personnel to upgrade embedded computers.

This conventional procedure also requires the availability of a replacement panel, which often presents inventory difficulties. The replacement panel must be of a height and have a bezel (hole and slot) arrangement as required by the specific number, stacking order, and external access needs of the circuit cards of the new configuration.

This conventional procedure is made more complicated by the use of inter-card electrical connectors that join one card in the card/panel assembly to another that is stacked immediately above or below the first. The inter-card connectors are often mounted on the faces of the cards. During disassembly of the card/panel unit, the card being replaced may have to be separated from another card in the stack by disconnecting the inter-card connectors. This poses a further risk of damage to the cards. The challenges of field reconfiguration in particular can all too often result in damage to these connectors.

It would be desirable to provide an improved panel arrangement that facilitates modularization of electronic equipment, while overcoming a number of the disadvantages noted herein. The new approach should ensure reliable mechanical and electrical connection between cards and with a backplane. The improvement should allow reconfiguration of the equipment in an efficient and economical manner, preferably even by personnel with no special training or tools.

SUMMARY OF THE INVENTION

The invention resides in a modular front panel system for circuit cards, which utilizes hinged, interlockable, first and second card-carrying front panels. Each panel has a hinge component that can mate with the component on the other panel. The hinged arrangement permits the panels to be releasably secured to one another so as to form a card assembly unit for facilitated insertion in electrical equipment and electrical connection with a backplane. The hinged arrangement also permits the panels to be moved angularly with respect to one-another, thereby facilitating assembly and disassembly of the two hinge components without obstruction by components mounted on the circuit cards. Moreover, the hinge arrangement permits a panel to be readily added and interlocked with, or removed from, an existing card assembly in electrical equipment, without always requiring disassembly of the existing front panel.

In a preferred embodiment, a first panel secures and supports at least a first circuit card, a second panel secures and supports at least a second circuit card, and a hinge is formed from a first hinge component, e.g., an elongate groove, on the first panel that mates with a second hinge component, e.g., a pivot element, on the second panel. For assembly, the pivot element, e.g., a single elongate bar, can be slid longitudinally along the groove, while the circuit cards are angularly separated for clearance of components mounted on the surfaces of the circuit cards. After the circuit cards are aligned in the horizontal direction, the circuit cards are moved angularly until they are in spaced, parallel relation. In that arrangement, the circuit cards are positioned, for example, so that edge-mounted backplane connectors carried by the cards are properly disposed for mating with corresponding connectors of a backplane.

In some applications, the first and second circuit cards may have surface-mounted electrical connectors that must mate with one-another. In such a case, the hinge components are slid together until the surface-mounted connectors are aligned horizontally, and then the circuit cards are moved angularly, e.g., by a few degrees, so that the connectors can be mated while being in vertical alignment.

It can thus be seen that the invention allows reconfiguration of the electrical equipment in an efficient and economical manner. In some applications, the invention also facilitates electrical connection between individual surface-mounted connectors on the circuit cards and between edge-mounted backplane connectors on the circuit cards and the corresponding connectors of a backplane.

BRIEF DESCRIPTION OF THE DRAWINGS

The aforementioned aspects, features and advantages of the invention as well as others, are explained in the following description taken in connection with the accompanying drawings, wherein.

DESCRIPTION OF THE PREFERRED EMBODIMENT

Figure 1:
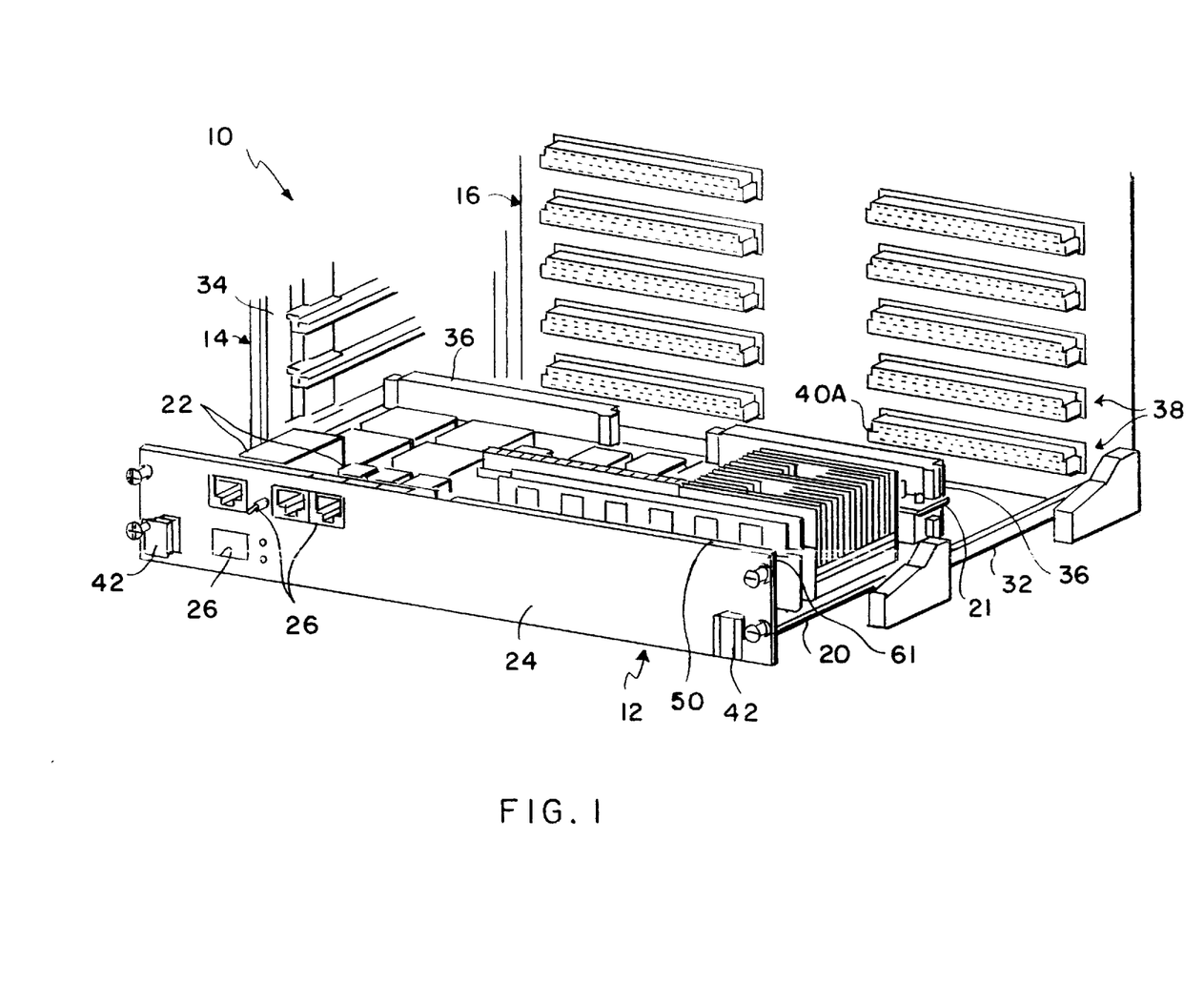
FIG. 1 is a perspective view of electronic equipment including a card assembly in accordance with an embodiment of the invention.

FIG. 1 shows electronic equipment 10 equipped to include a plurality of card assemblies, of which only card assembly 12 is shown. As illustrated, card assembly 12 is being installed into a card rack 14 for electrical connection with a backplane 16. The card assembly 12 can be, for example, an embedded computer.

Card assembly 12 includes at least one circuit card (two are shown, designated 20, 21), on which are mounted a number of conventional electrical devices 22. The circuit cards 20, 21 are secured to a front plate 24. The front plate 24 serves as a bezel, having a number of openings 26 for accessing selected ones of the electrical devices 22 on the cards 20, 21, such as, for example, I/O connectors, special indicators or switches.

The card rack 14 includes a plurality of card rails or guides 32 on the left and right hand side of the equipment 10 used for supporting the circuit cards 20, 21 within an enclosure 34. For completion of the illustrated installation, the card assembly 12 is slid rearwardly along the rails 32 until connectors 36 on the cards 20, 21 mate and make electrical connection with corresponding connectors 38 of the backplane 16. (When the connectors 36, 38 are properly positioned, contacts 40A and 40B (FIG. 8) electrically contact one-another.) For removal of the card assembly 12, ejectors 42 are used to assure perpendicular retraction of the card assembly 12 from the backplane connectors 38. The connectors 36, 38 and ejectors 42 are of conventional design.

Figure 2:
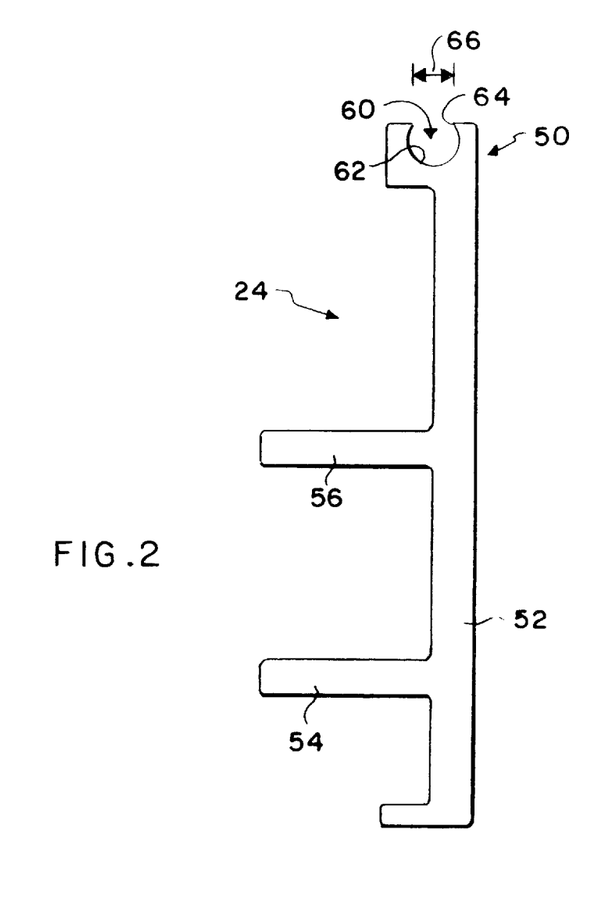
FIG. 2 is a side view of the front panel of the card assembly of FIG. 1.
Figure 6:
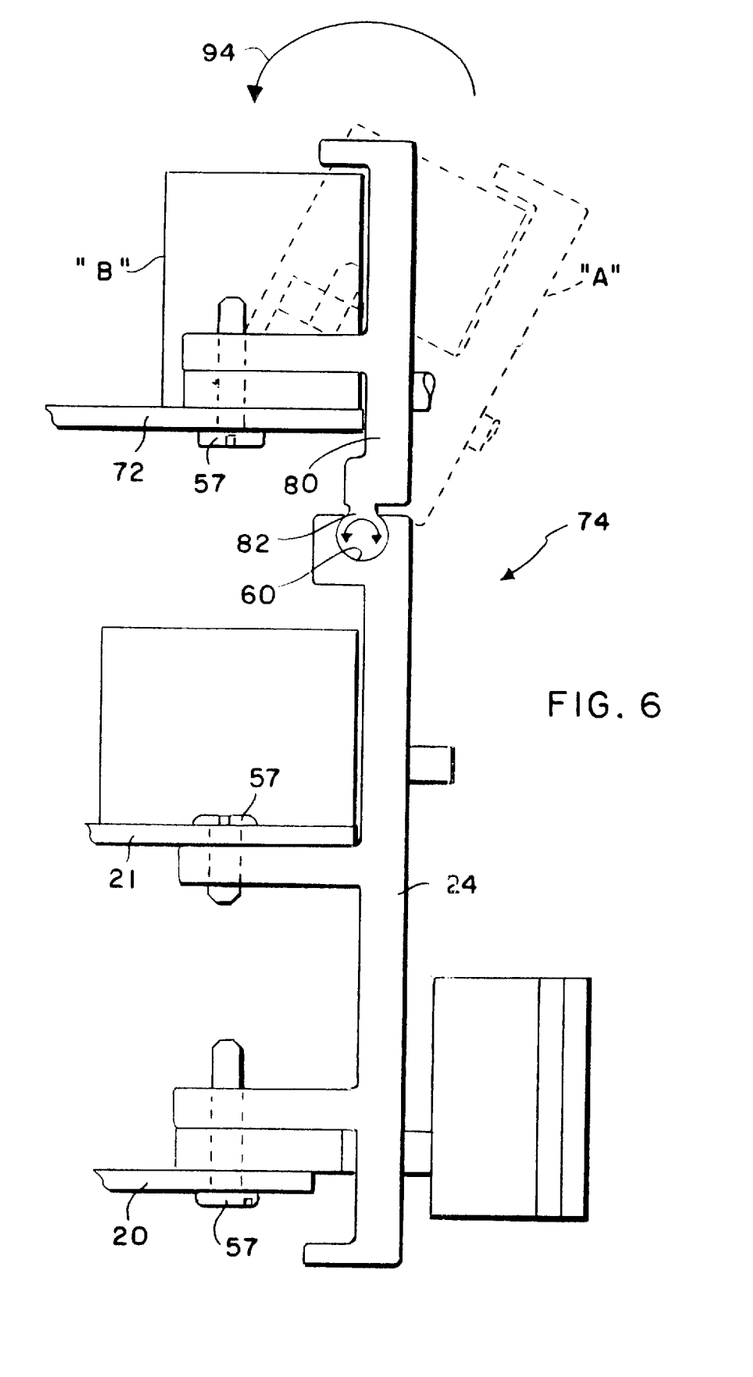
FIG. 6 is a side view of the combined card assembly of FIG. 5.

FIG. 2 shows a side view of the front panel 24, which can be, for example, extruded from Aluminum (or otherwise made) and machined. The front panel 24 has a planar face plate 52, and first and second card-mounting, plate-like abutments 54, 56 that extend in spaced parallel relation to one-another perpendicularly from the face plate 52. The abutments 54, 56 support a front edge of the circuit cards 20, 21, as can be appreciated from FIG. 6. The circuit cards 20, 21 are secured to the abutments 54, 56 by conventional means, such as screws 57 (FIG. 6)

The hinge component 50 is shown in FIG. 2 as a groove 60 of generally an arcuate or "U" shape cross-section that extends along and is open towards the top side of the panel 24 and on at least one of its ends 61. Actually, as can be seen in FIG. 2, the groove's internal surface 62 is in cross-section preferably an arc of a circle slightly larger than 180°. That angle produces short inwardly directed edges 64, which can also be called stops for reasons that will be explained shortly. Essentially, the stops 64 produce an opening 66 for the groove 60 that is narrower than it would be if the groove were, say, semi-circular in cross-section.

Figure 3:
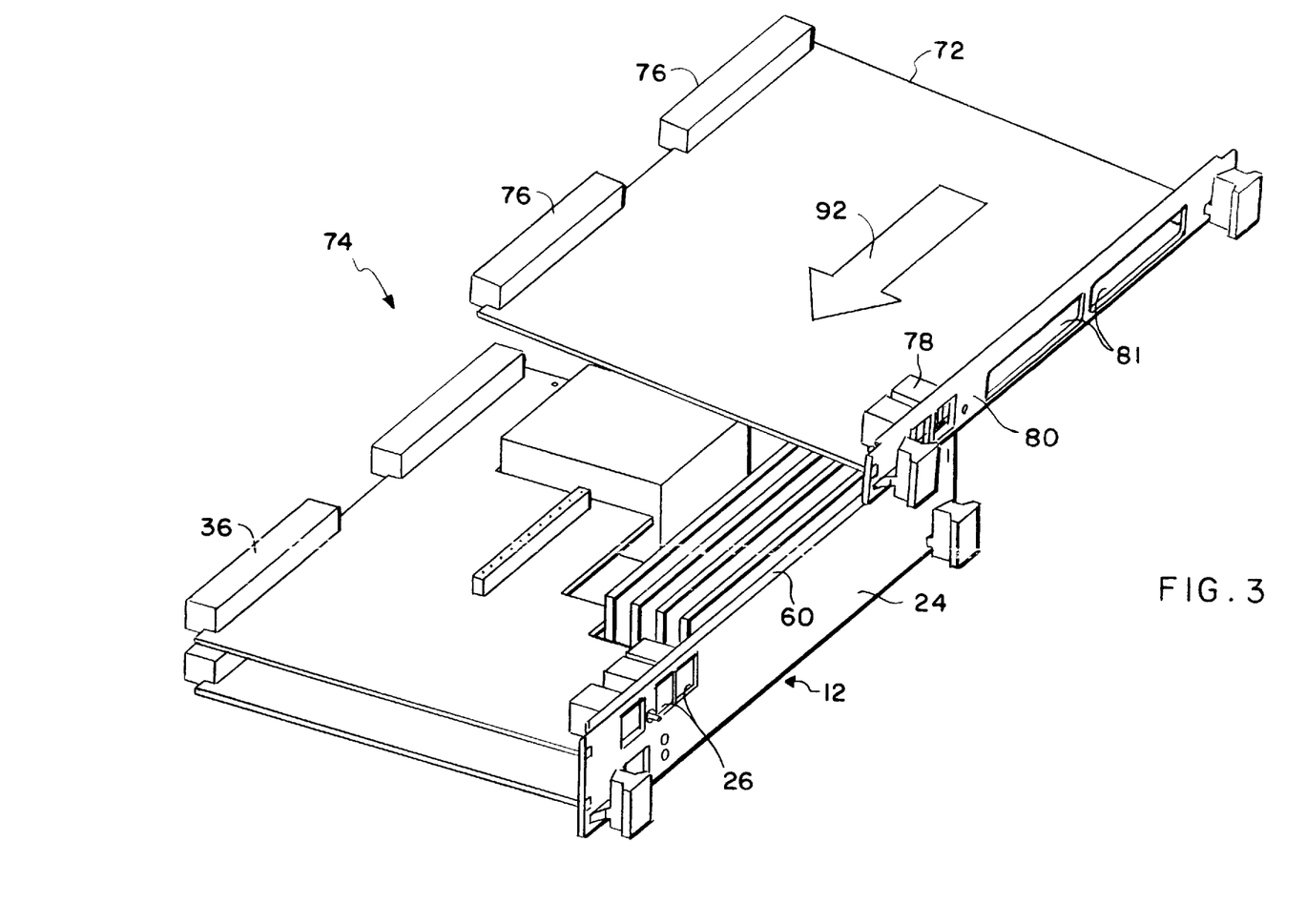
FIG. 3 is an illustration of a first stage of mounting a second card assembly on the first card assembly of FIG. 1.
Figure 7:
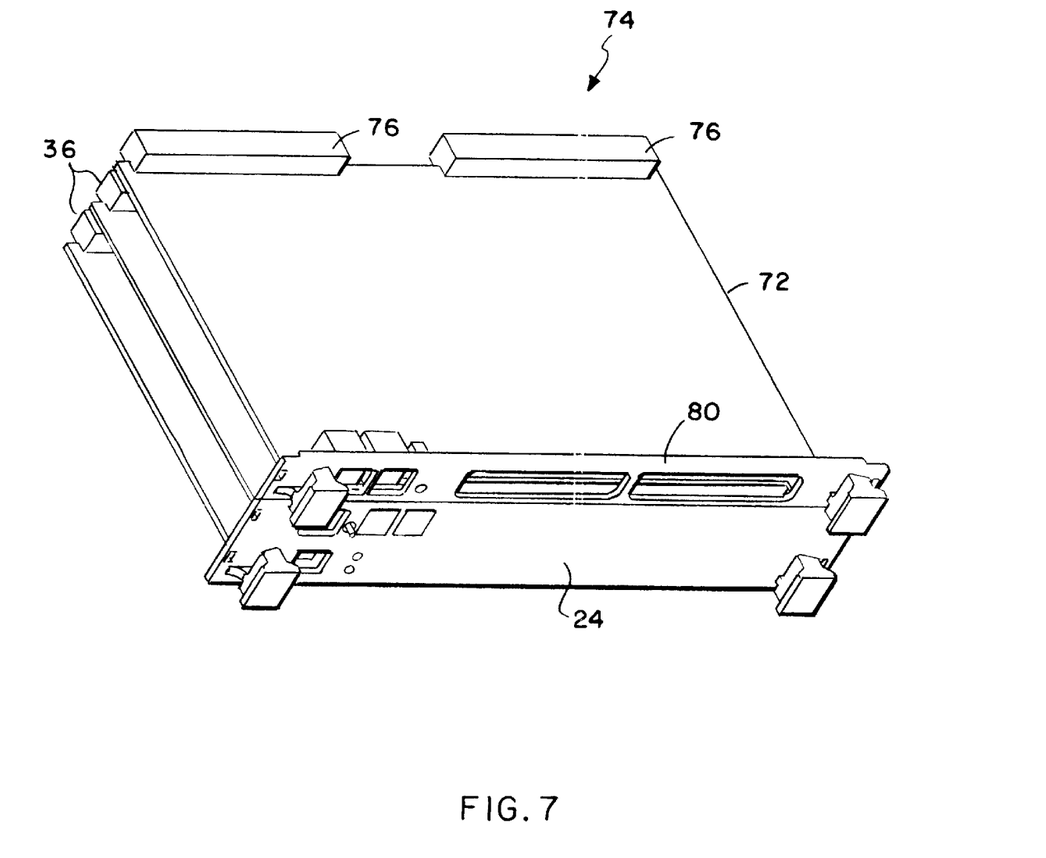
FIGS. 7 and 8 are perspective views of the combined card assembly of FIG. 5.
Figure 8:
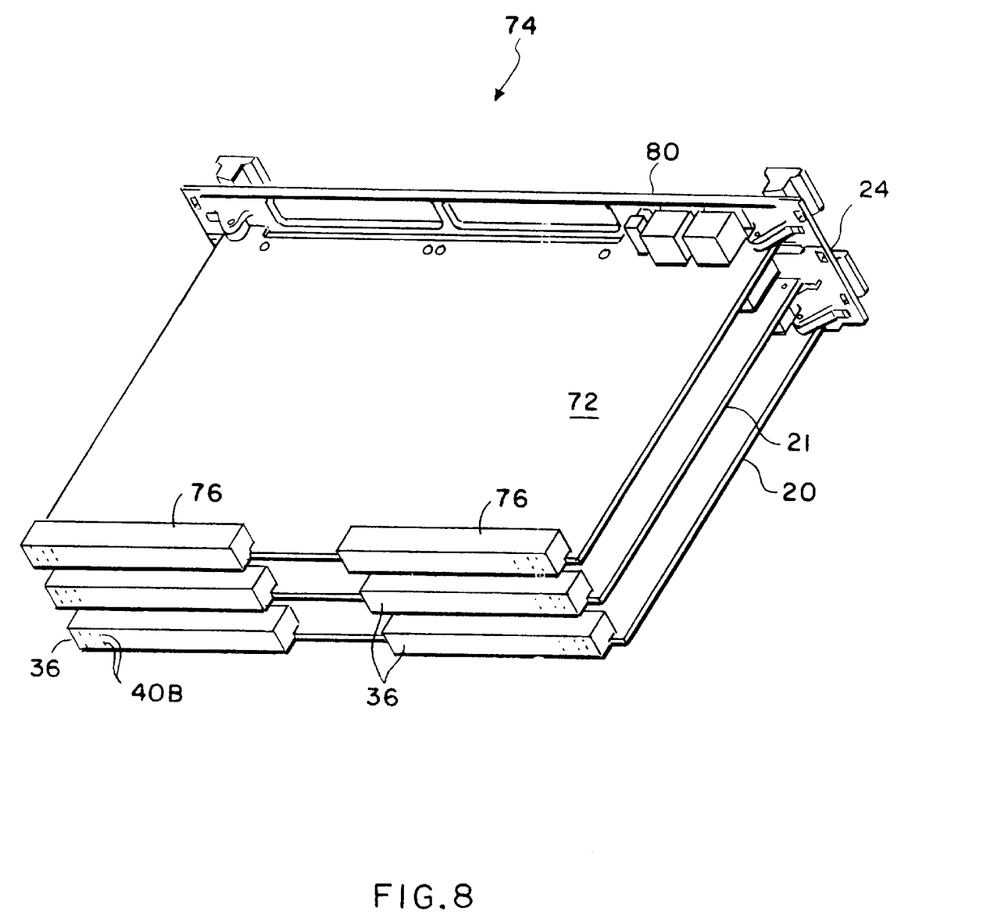

In the event that the configuration of the equipment 10 needs to be changed, the invention can be practiced to facilitate that change. As an example of such a configuration change, FIG. 3 shows the addition of a third circuit card 72 to the card assembly 12 to form a combined card assembly 74. Actually, FIG. 3 shows a first stage in the procedure of adding the third circuit card 72, while FIG. 5 shows the second stage, and FIG. 6–8 illustrate the final result, i.e., the combined card assembly ready for installation in equipment 10.

The illustrated third circuit card 72 is equipped with backplane connectors 76 and electrical devices 78. The backplane connectors 76 are the same as backplane connectors 36 of cards 20, 21. Significantly, the third circuit card 72 also has an add-on front panel 80 in accordance with the invention. In addition to holes and slots 81 like the openings 26 of front panel 24, and a card-mounting abutment 83 (FIG. 4) like abutments 54, 56, the add-on panel 80 includes a special feature for its attachment to front panel 24.

Figure 4:
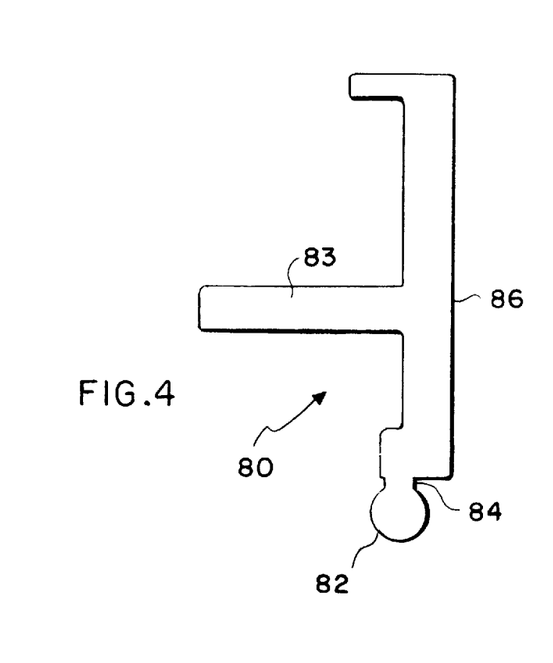
FIG. 4 is a side view of the front panel of the second card assembly of FIG. 3.

FIG. 4 shows the front panel 80 as having a pivot bar 82 of cylindrical geometry connected by a short, narrow plate-like neck 84 to the bottom of a face plate 86. Just as the groove 60 (FIG. 2) extends substantially the entire length of plate 52 (FIG. 2), pivot bar 82 (and neck 84) preferably extend substantially the entire length of plate 86. Pivot bar 82 is sized, configured, and disposed to be receivable within the groove 60 (FIG. 2), with the neck 84 extending through opening 66.

Figure 5:
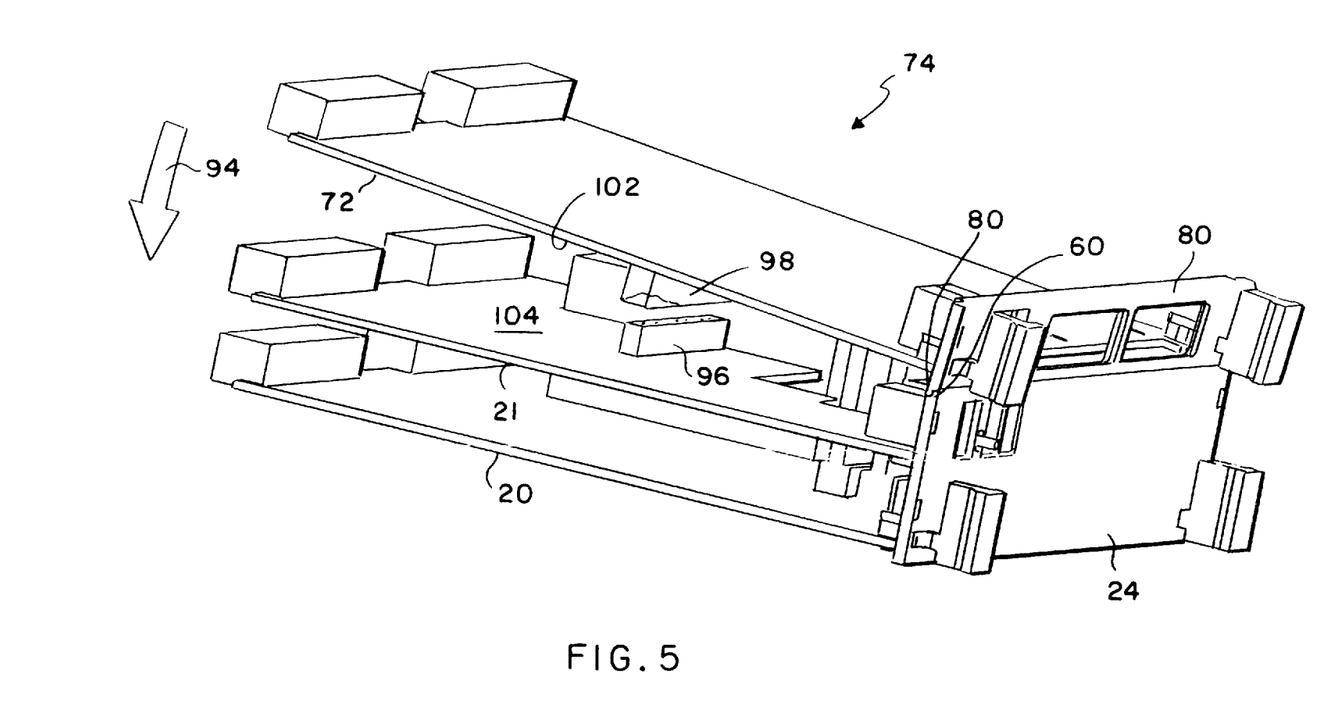
FIG. 5 is an illustration of a second stage of mounting the second card assembly on the first card assembly to form a combined card assembly.

With reference to FIGS. 3, 5, and 6, assembly of the combined card assembly 74 will now be described. The pivot bar 82 is slid in a horizontal direction indicated by arrow 92 of FIG. 3 into one end 61 of and then along groove 60 of panel 24 until the panels 24, 80 align horizontally. Preferably, this is carried out while the panels 24, 80 are angularly offset from one-another, i.e., while panel 80 is in relative position "A" as shown in phantom in FIG. 6. Subsequently, the circuit card 72 is angularly displaced towards the circuit cards 20, 21 in the direction of arrow 94 by hinging action of the pivot bar 82 in groove 60. This will bring the circuit cards 20, 21, 72 into the desired spaced, parallel relation, as can be seen with panel 80 is shown in relative position "B" in FIG. 6. Assembling the combined assembly 74 in this way assures that components surface-mounted on the circuit cards 20, 72 will not get in the way and will not be damaged.

In both positions "A" and "B", the panel 80 is captured within the groove 60 and prevented from translation vertically out of the groove 60 by stops 64 (FIG. 2). Thus, the geometry of the pivot element 82, neck 84, groove 60, and stops 64 enables their cooperation in permitting relative sliding and angular motion of the panels 24, 80, while preventing their unintended separation during handling.

In some applications, the circuit cards 21, 72 may have electrical connectors 96, 98 (FIG. 4) mounted on their confronting surfaces 102, 104. In this case, the action of angularly moving the cards 21, 72 together will also cause the connectors 96, 98 to mate. Many such connectors require nearly complete alignment (vertical and horizontal) of the contacts within the connectors to avoid damage to them; the invention permits such alignment and ensures the avoidance of such damage.

FIGS. 7 and 8 show the combined assembly 74 ready for re-insertion in the equipment 10 of FIG. 1. It should be noted in FIG. 7 that the panels 24, 80 provide a planar front surface that provides comfort to onlookers that backplane connectors 36, 76 are indeed properly connected with connectors 38. Also, because of the construction of the hinge arrangement provided by the groove 60 and pivot bar 82, the panels 24, 80 provide an EMI shield without the need for a shielding gasket (not shown) between the panels. Moreover, as best seen in FIG. 8, the invention assures proper positioning of the backplane connectors 36, 76.

Figure 9:
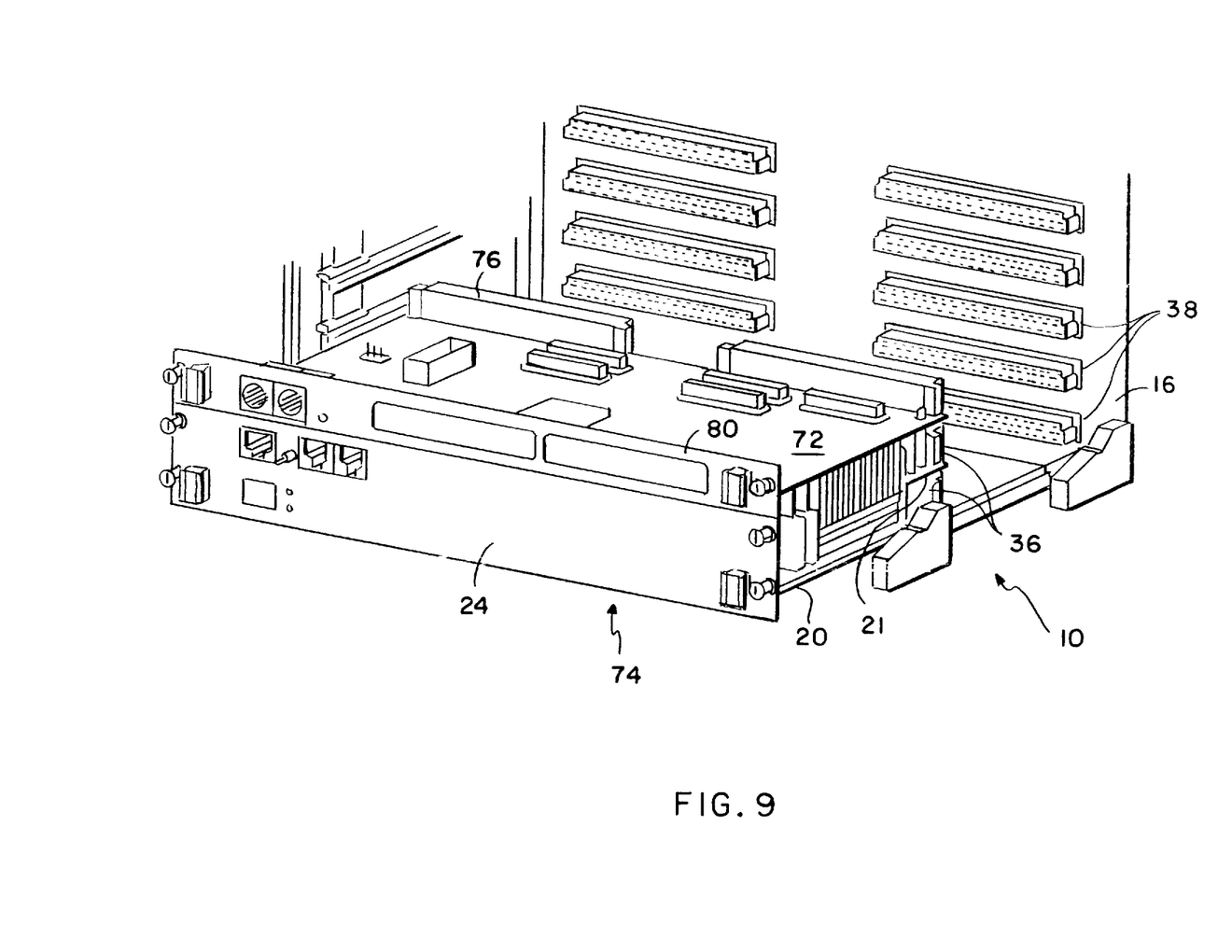
FIG. 9 is a perspective view of electronic equipment including the combined card assembly of FIGS. 5–8.

FIG. 9 shows the combined card assembly 74 being re-installed. As the combined card assembly 74 is moved rearwardly, the backplane connectors 36, 76 of all cards 20, 21, and 72 will automatically be in registration and will automatically make electrical connection with the corresponding connectors 38 of the backplane 16.

Figure 10:
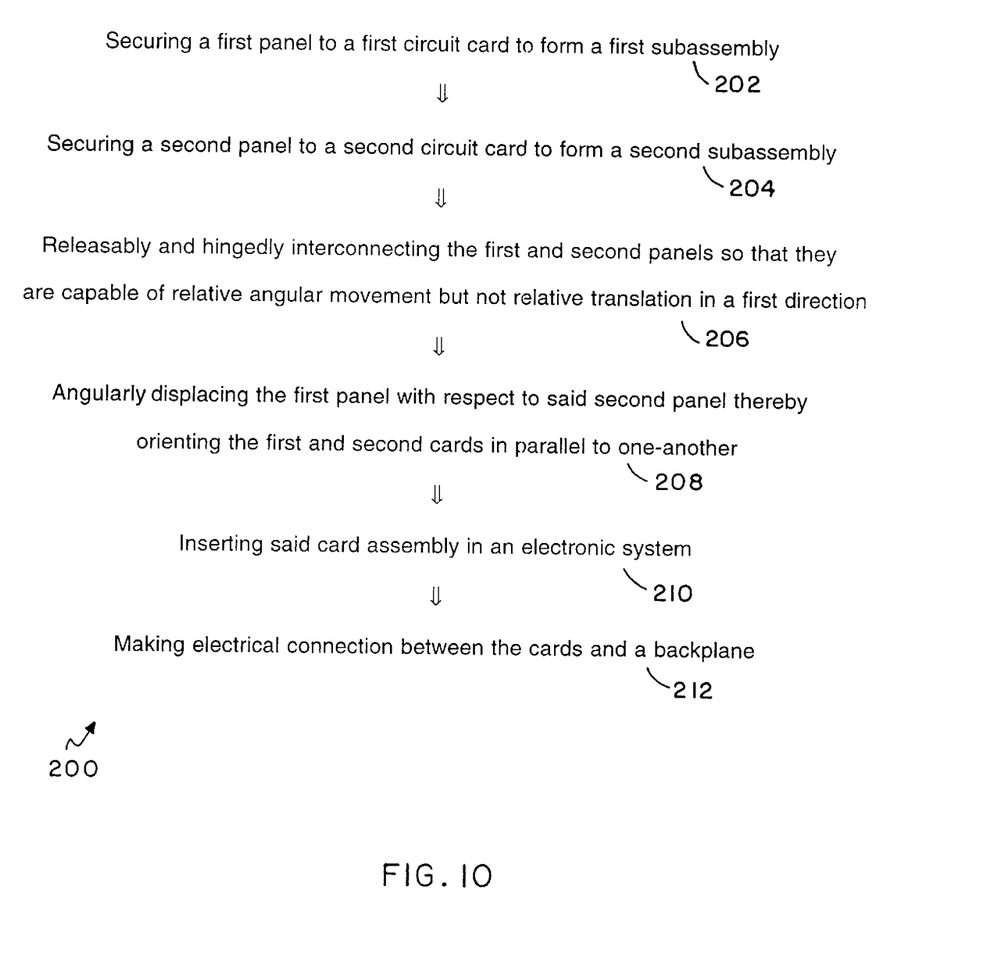
FIG. 10 is a flow chart of a method of assembling electronic equipment using the first and second card assemblies of FIGS. 5–8.

FIG. 10 depicts a method 200 for assembling an electronic system. Step 202 entails securing a first panel to a first circuit card to form a first subassembly, and step 204 entails securing a second panel to a second circuit card to form a second subassembly. Step 206 entails releasably and hingedly interconnecting the first and second panels so that they are capable of relative angular movement but not relative translation in a first direction. This can be performed by, e.g., by sliding a pivot bar in a groove on the respective panels while the panels are angularly offset. Then, step 208 entails angularly displacing the first panel with respect to said second panel thereby orienting the first and second cards in parallel to one-another, and then, in step 210, the card assembly is inserted in an electronic system. Finally, step 212 entails making electrical connection between the cards and a backplane.

ALTERNATIVE EMBODIMENTS

The foregoing description has been limited to a specific embodiment of the invention. It will be apparent, however, that variations and modifications may be made to the embodiment, with the attainment of some or all of the advantages of the invention.

For example, the pivot element and the groove can be of geometries different from that described hereinabove. Also, the hinge can be formed as a so-called 'piano-hinge', having a plurality of spaced pivot elements, e.g., with bulbous ends, instead of a single pivot bar, and the groove can have intermittent openings along one side so as to permit the hinge components to interlock without having to slide the components from their ends. As a further example, the face plates can be made from a material and dimensioned to permit the pivot bar to snap fit into the groove through opening 66, and yet be retained therein during normal use.

Therefore, it is the object of the appended claims to cover all such variations and modifications as come within the true spirit and scope of the invention.

What is claimed as new and desired to be secured by Letters Patent is:

1. A panel to which a first circuit card can be mounted for installation in electronic equipment, said panel comprising:
   A) a face plate;
   B) a card attaching structure connected to said face plate for attaching said first circuit card to said face plate; and
   C) a hinge component connected to said face plate for interlocking with a second hinge component of a second panel, wherein said hinge component includes a groove extending along substantially an entire first side of said face plate and opening on at least a first end of said face plate.

2. The panel in accordance with claim 1, wherein said face plate, said card attaching structure, and said hinge component are of integral, one-piece construction.

3. The panel in accordance with claim 1, wherein said groove is characterized by an arcuate cross-section.

4. The panel in accordance with claim 1, in combination with said first circuit card, and a plurality of fasteners for securing said first circuit card to said card mounting structure.

5. The combination of claim 4, wherein said first circuit card comprising a printed circuit board.

6. The panel in accordance with claim 1, in combination with said second panel, and wherein said second panel includes a second hinge component comprising a pivot bar receivable within said groove for hingedly connecting said second panel to said face plate.

7. The combination of claim 6, wherein said second panel includes:
   A) a second face plate;
   B) a second card attaching structure connected to said second face plate for attaching a second circuit card to said second face plate; and
   C) a second hinge component connected to said second face plate and including said pivot bar for hingedly connecting said second face plate to said first face plate.

8. The combination in accordance with claim 7, wherein said second card attaching structure can maintain said second circuit card in parallel relation to said first circuit card.

9. The combination in accordance with claim 7, wherein said pivot bar is pivotally retained within said groove such that said second face plate can pivot between a first position in which said second face plate is substantially coplanar with said face plate, and a second position in which said second face plate is angularly offset from said face plate.

10. The panel in accordance with claim 1, wherein said hinge component comprises a pivot bar receivable within a groove defined by said second hinge component of said second panel for hingedly interlocking said second panel to said face plate.

11. An assembly system for securing together first and second circuit cards for installation in electronic equipment, said assembly system comprising:
   A) a first panel comprising a first face plate; a first card attaching structure connected to said first face plate for attaching said first circuit card to said first face plate; a first hinge component including a groove extending along a first side of said face plate; and
   B) a second panel comprising a second face plate; a second card attaching structure connected to said second face plate for attaching said second circuit card to said second face plate; a second hinge component including a pivot bar connected to said second face plate and pivotally receivable within said groove of said first hinge component;
   C) wherein said groove and said pivot bar of said respective first and second hinge components cooperate to enable said second face plate to pivot from a first position in which said second face plate is substantially coplanar with said first face plate and said second circuit card is in substantially spaced parallel relation to said first circuit card, and a second position in which said second face plate is angularly offset from said first face plate and said second circuit card is angular offset from said first circuit card.

12. The assembly system in accordance with claim 11, wherein said first face plate, said first card attaching structure, and said first hinge component are of integral, one-piece construction, and said second face plate, said second card attaching structure and said second hinge component are of integral, one-piece construction.

13. The assembly system in accordance with claim 11, wherein said first face plate, said first card attaching structure, and said first hinge component comprise a first extrusion, and said second face plate, said second card attaching structure and said second hinge component comprise a second extrusion.

14. The assembly system in accordance with claim 11, wherein said groove extends along substantially the entire first side of said first face plate and opens proximate a first end of said face plate.

15. The assembly system in accordance with claim 11, wherein said groove is characterized by an arcuate cross-section.

16. The assembly system in accordance with claim 11, wherein said pivot bar can slide transversely within said groove to facilitate assembly and disassembly.

17. An assembly system for securing together first and second circuit cards for installation in electronic equipment; said first and second circuit cards including respective matable first and second electrical card connectors for electrically interconnecting said first and second circuit cards, and respective first and second backplane connectors for electrically connecting said first and second circuit cards to a backplane, said assembly system comprising:
   A) a first panel comprising a first face plate; a first card attaching structure connected to said first face plate for attaching said first circuit card to said first face plate; a first hinge component including a groove extending along a first side of said face plate; and
   B) a second panel comprising a second face plate; a second card attaching structure connected to said second face plate for attaching said second circuit card to said second face plate; a second hinge component connected to said second face plate and including a pivot bar pivotally receivable within said groove of said first hinge component; wherein said groove and said pivot bar of said respective first and second hinge components cooperate to enable said second face plate to pivot between a first position and a second position;
      (i) said first position enabling said second circuit card to be disposed in substantially spaced parallel relation to said first circuit card so as to maintain said card connectors in electrical connection with one-another, and said backplane connectors in positions relative to one-another for registration with corresponding connectors of said backplane; and
      (ii) said second position enabling said second circuit card to be angularly offset from said first circuit card, thereby enabling said first and second card connectors to be separated from one another, and facilitating disassembly of said first panel from said second panel.

18. An electronic system comprising:
   A) a first panel;
   B) first means for securing said first panel to a first circuit card to form a first subassembly;
   C) a second panel;
   D) second means for securing said second panel to a second circuit card to form a second subassembly;
   E) hinge means for releasably and hingedly attaching said first subassembly to said second subassembly, thereby forming a card assembly;
   F) a card rack for supporting said card assembly; and
   G) a backplane electrically connectable to at least one of said first and second circuit cards of said card assembly.

19. The electronic system in accordance with claim 18, wherein said hinge means comprises means for coupling a first portion of said first panel to a second portion of said second panel such that said first portion and second portion are capable of relative angular movement and are prevented from relative translational movement in at least one direction.

20. The electronic system in accordance with claim 19, wherein said hinge means further comprises means for slidably receiving a first portion of one of said first and second panels in a second portion of the other of said first panel and second panels while said first and second circuit cards are angularly offset from one-another.

21. The electronic system in accordance with claim 19, wherein said hinge means enables angularly displacement of said first portion with respect to said second portion so as to enable said first and second circuit cards to be oriented at preselected angular relations, including parallel to one-another.

22. The electronic system in accordance with claim 19, further including a card rack for receiving and holding said card assembly, and a backplane for making electrical connection with at least one of said first and second cards.

23. A method of assembling an electronic system, comprising the steps of:
   A) securing a first panel to a first circuit card to form a first subassembly;
   B) securing a second panel to a second circuit card to form a second subassembly;
   C) attaching said first subassembly to said second subassembly, comprising the step of releasably and hingedly interconnecting said first panel to said second panel, thereby forming a card assembly; and D) inserting said card assembly in said electronic system.

24. The method of assembling an electronic system in accordance with claim 23, wherein step (C) is performed after steps (A) and (B).

25. The method of assembling an electronic system in accordance with claim 23, wherein step (C) comprises the step of attaching a first portion of said first panel to a second portion of said second panel such that said first portion and second portion are capable of relative angular movement and are prevented from relative translational movement in at least one direction.

26. The method of assembling an electronic system in accordance with claim 23, wherein step (C) comprises the step of slidingly receiving a first portion of one of said first and second panels in a second portion of the other of said first and second panels while said first and second circuit cards are angularly offset from one-another.

27. The method of assembling an electronic system in accordance with claim 23, wherein step (C) further comprises the step of angularly displacing said first portion with respect to said second portion thereby orienting said first and second circuit cards in parallel to one-another.

28. The method of assembling an electronic system in accordance with claim 23, further comprising the step of sliding said card assembly along a card rack, and making electrical connection between at least one of said first and second cards and a backplane.

29. A panel to which a first circuit card can be mounted for installation in electronic equipment, said panel comprising:

A) a face plate;

B) a card attaching structure connected to said face plate for attaching said first circuit card to said face plate; and C) a first hinge component connected to said face plate for interlocking with a second hinge component of a second panel, wherein said first hinge component includes a groove extending along a first side of said face plate, and wherein said groove is characterized by an arcuate cross section.

30. The panel in accordance with claim 29, wherein said groove extends along substantially the entire first side of said face plate and opens on at least a first end of said face plate.

31. The panel in accordance with claim 29, wherein said second hinge component comprises a pivot bar receivable within said groove for hingedly connecting said second panel to said face plate.

32. A panel to which a first circuit card can be mounted for installation in electronic equipment, said panel comprising:

A) a face plate;

B) a card attaching structure connected to said face plate for attaching said first circuit card to said face plate; and C) a first hinge component connected to said face plate for interlocking with a second hinge component of a second panel, wherein said first hinge component comprises a pivot bar receivable within a groove defined by said second hinge component of said second panel for hingedly interlocking said second panel to said face plate.

33. The panel in accordance with claim 32, wherein said face plate, said card attaching structure, and said first hinge component are of integral, one-piece construction.

34. The panel in accordance with claim 32, wherein said groove extends along substantially an entire first side of said second panel and opens on at least a first end of said second panel.

35. The panel in accordance with claim 32, wherein said groove is characterized by an arcuate cross-section.

36. The panel in accordance with claim 32, in combination with said second panel, and wherein said second panel further includes:

A) a second face plate connected to said second hinge component; and

B) a second card attaching structure connected to said second face plate for attaching said a second circuit card to said second face plate.

37. The combination in accordance with claim 36, wherein said second card attaching structure can maintain said second circuit card in parallel relation to said first circuit card.

38. The panel in accordance with claim 32, in combination with said second panel, wherein said pivot bar is pivotally retained within said groove such that said second face plate can pivot between a first position in which said second face plate is substantially coplanar with said face plate, and a second position in which said second face plate is angularly offset from said face plate.

* * * * *